(12) United States Patent
Park

(10) Patent No.: US 10,587,243 B2
(45) Date of Patent: Mar. 10, 2020

(54) SAW FILTER DEVICE AND METHOD OF MANUFACTURING THE SAME

(71) Applicant: Samsung Electro-Mechanics Co., Ltd., Suwon-si (KR)

(72) Inventor: Jang Ho Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 34 days.

(21) Appl. No.: 15/480,841

(22) Filed: Apr. 6, 2017

(65) Prior Publication Data
US 2018/0041191 A1 Feb. 8, 2018

(30) Foreign Application Priority Data
Aug. 8, 2016 (KR) .......... 10-2016-0100668

(51) Int. Cl.
| H03H 9/64 | (2006.01) |
| H03H 3/08 | (2006.01) |
| H01L 41/047 | (2006.01) |
| H01L 41/29 | (2013.01) |

(52) U.S. Cl.
CPC .......... H03H 9/64 (2013.01); H01L 41/0477 (2013.01); H01L 41/29 (2013.01); H03H 3/08 (2013.01)

(58) Field of Classification Search
CPC ........ H03H 9/64; H03H 3/08; H01L 41/0477; H01L 41/29
See application file for complete search history.

(56) References Cited

U.S. PATENT DOCUMENTS

| 9,331,667 | B2 | 5/2016 | Steiner et al. | |
| 2002/0047495 | A1 | 4/2002 | Nakano et al. | |
| 2003/0122453 | A1* | 7/2003 | Yamada | H03H 3/08 310/363 |
| 2006/0076851 | A1* | 4/2006 | Fujimoto | H03H 3/08 310/313 R |
| 2006/0273687 | A1* | 12/2006 | Fujimoto | H03H 3/08 310/313 R |
| 2012/0200371 | A1* | 8/2012 | Yamashita | H03H 3/08 333/133 |
| 2013/0285504 | A1 | 10/2013 | Tamasaki | |

FOREIGN PATENT DOCUMENTS

| JP | 3411908 B2 | 3/2003 |
| JP | 2007-28235 A | 2/2007 |
| JP | 5565474 B2 | 6/2014 |

* cited by examiner

Primary Examiner — Stephen E. Jones
Assistant Examiner — Samuel S Outten
(74) Attorney, Agent, or Firm — NSIP Law

(57) ABSTRACT

A surface acoustic wave (SAW) filter device includes: a first layer disposed on a substrate; an inter-digital transducer (IDT) electrode layer disposed on the first layer; a second layer covering the IDT electrode layer and the first layer; and an overlay layer covering the second layer, wherein the first layer includes any one or any combination of any two or more of a metal layer, a metal oxide layer, and an oxide layer.

20 Claims, 6 Drawing Sheets

SAW FILTER DEVICE AND METHOD OF MANUFACTURING THE SAME

CROSS-REFERENCE TO RELATED APPLICATIONS

This application claims the benefit of Korean Patent Application No. 10-2016-0100668, filed on Aug. 8, 2016 in the Korean Intellectual Property Office, the entire disclosure of which is incorporated herein by reference for all purposes.

BACKGROUND

1. Field

The following description relates to a surface acoustic wave (SAW) filter device and a method of manufacturing a SAW filter device.

2. Description of Related Art

A surface acoustic wave (SAW) filter, which is a frequency band filter, passes only a frequency of a desired pass band and attenuates a frequency of an undesired band. Generally, the SAW filter includes an inter-digital transducer (IDT) electrode having a comb pattern and formed on a piezoelectric substrate, and the SAW filter selects a frequency using a surface acoustic wave generated by applying a voltage to the IDT electrode.

A surface acoustic wave filter manufactured by an overlay method, which is used to suppress a change in frequency characteristics due to a change in temperature among SAW filters, adopts a structure in which a multilayered IDT electrode layer, formed mainly of copper, is formed on a $LiNbO_3$ wafer substrate, and an overlay layer formed of silicon oxide ($SiO_2$) is formed so as to sufficiently cover the IDT layer and the substrate.

However, unlike the $LiNbO_3$ wafer substrate, the overlay layer includes silicon oxide ($SiO_2$), which is a material that varies a propagation speed of the surface acoustic wave (SAW), depending on temperature, to decrease a frequency variation depending on temperature.

Further, a problem can occur when adhesion between the electrode layer, which is formed of copper, and a lithium niobate (LN) wafer substrate is not strong, because copper metal atoms may be comparatively easily diffused in an electrode layer formed of copper, and it is difficult to perform dry etching to pattern the electrode layer in a fine line-width.

Thus, there is a need to develop a structure in which adhesion among the IDT electrode layer including copper as a main component, the $LiNbO_3$ wafer substrate, and the overlay layer, formed of silicon oxide, is excellent. Further, there is a need to develop a structure capable of preventing copper metal ions from moving to the $LiNbO_3$ wafer substrate, since the copper metal atoms of the IDT electrode layer move comparatively easily, thus oxidizing the IDT electrode layer due to the use of DC voltage.

Furthermore, it is desirable to develop a structure in which patterning of an IDT electrode layer to have a uniform and fine line-width may be easily performed.

As a result, there is a need to develop a structure capable of preventing the copper metal from oxidizing and migrating, so that an IDT electrode layer having a uniform and fine line-width, while having a low resistance, may be realized, and to develop a structure that increases adhesion among the overlay layer, the IDT electrode layer and the substrate, while smoothing transmission of the surface acoustic wave.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a surface acoustic wave (SAW) filter device includes: a first layer disposed on a substrate; an inter-digital transducer (IDT) electrode layer disposed on the first layer; a second layer covering the IDT electrode layer and the first layer; and an overlay layer covering the second layer, wherein the first layer includes any one or any combination of any two or more of a metal layer, a metal oxide layer, and an oxide layer.

The first layer may include the metal layer, and the metal layer may include any one or any combination of any two or more of titanium (Ti), chromium (Cr), and aluminum (Al), or an alloy layer including titanium (Ti), chromium (Cr), and aluminum (Al).

The first layer may further include a metal oxide layer including any one or any combination of any two or more of titanium oxide ($TiO_x$), chromium oxide ($CrO_x$), and aluminum oxide ($Al_2O_x$).

The metal layer may be disposed under the IDT electrode layer.

The second layer may include a metal oxide layer including any one or any combination of any two or more of titanium oxide ($TiO_x$), chromium oxide ($CrO_x$), and aluminum oxide ($Al_2O_x$).

A material of the first layer may be the same as a material of the second layer.

The second layer may have a thickness in a range of 3 nm to 20 nm.

The overlay layer may include silicon oxide ($SiO_2$).

The first layer may have a thickness in a range of 3 nm to 20 nm.

In another general aspect, a method to manufacture a surface acoustic wave (SAW) filter includes: forming a first layer on a substrate; forming inter-digital transducer (IDT) electrode layers on the first layer; forming a second layer to cover the first layer and the IDT electrode layers; and forming an overlay layer to cover the second layer.

The forming of the IDT electrode layers may include oxidizing a portion of the first layer other than a portion of the first layer disposed under the IDT electrode layers to form a metal oxide layer.

The first layer may include a metal layer, and the metal layer may include any one or any combination of any two or more of titanium (Ti), chromium (Cr), and aluminum (Al), as a main component, or an alloy layer including titanium (Ti), chromium (Cr), and aluminum (Al), as a main component.

The metal oxide layer may include any one or any combination of any two or more of titanium oxide ($TiO_x$), chromium oxide ($CrO_x$), and aluminum oxide ($Al_2O_x$).

The second layer may include a metal oxide layer including any one or any combination of any two or more of titanium oxide ($TiO_x$), chromium oxide ($CrO_x$), and aluminum oxide ($Al_2O_4$).

The first layer may include a metal oxide layer including any one or any combination of any two or more of titanium oxide ($TiO_x$), chromium oxide ($CrO_x$), and aluminum oxide ($Al_2O_x$).

The second layer may include a metal oxide layer including any one or any combination of any two or more of titanium oxide ($TiO_x$), chromium oxide ($CrO_x$), and aluminum oxide ($Al_2O_4$).

The overlay layer may include silicon oxide ($SiO_2$).

The substrate may include either one of $LiNbNO_3$ and $LiTaO_3$.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
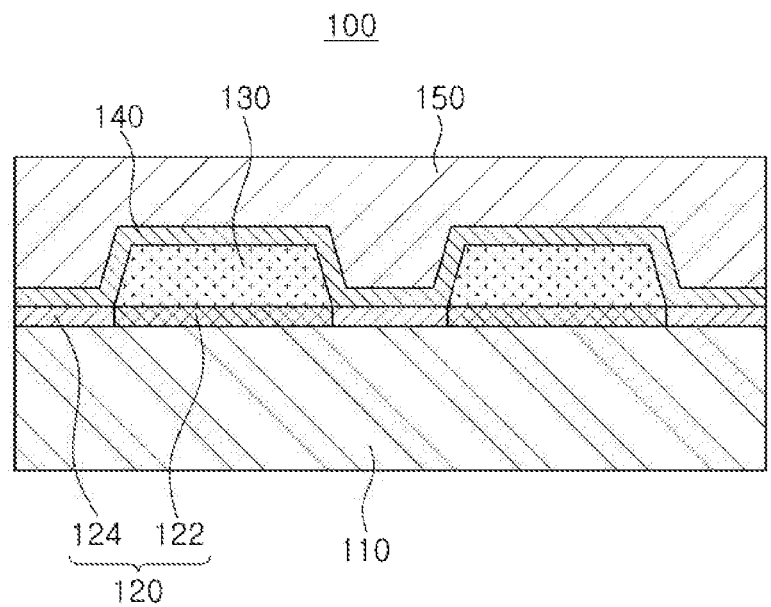
FIG. 1 is a schematic cross-sectional view showing a surface acoustic wave filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view showing a surface acoustic wave filter device 100, according to an embodiment.

Referring to FIG. 1, the surface acoustic wave filter device 100 includes, for example, a substrate 110, a first layer 120, an IDT electrode layer 130, a second layer 140, and an overlay layer 150.

The substrate 110 is, for example, a $LiNbO_3$ substrate (LN wafer substrate). However, the substrate is not limited to such an example, and therefore the substrate 110 may be either a $LiNbO_3$ substrate or a $LiTaO_3$ substrate used as a piezoelectric substrate.

The first layer 120 is formed on the substrate 110. For example, the first layer 120 includes a metal layer 122 and a metal oxide layer 124.

The metal layer 122 is disposed under the IDT electrode layer 130, to be described below. Further, the metal oxide layer 124 is disposed in a portion of the first layer 120 other than a portion of the first layer 120 disposed under the IDT electrode layer 130.

FIG. 1 illustrates an example in which the metal layer 122 has a width equal to a width of the IDT electrode layer 130. However, the width of the metal layer 122 is not limited to this example. Therefore, the metal layer 122 may have a width that is less than or greater than a width of the IDT electrode layer 130, and may be disposed in a portion between the IDT electrode layer 130 and the substrate 110.

Further, the metal layer 122 may be formed of any one or any combination of any two or more of titanium (Ti), chromium (Cr), and aluminum (Al), as a main component. Alternatively, the metal layer 122 may be formed of an alloy layer including any one or any combination of any two or more of titanium (Ti), chromium (Cr), and aluminum (Al), as a main component. Further, the metal oxide layer 124 may be formed of any one or any combination of any two or more of titanium oxide ($TiO_x$), chromium oxide ($CrO_x$), and aluminum oxide ($Al_2O_x$).

As an example, the metal oxide layer 124 is formed by oxidation of the metal layer 122. Describing this in more detail, the first layer 120, formed of the metal layer 122, is formed on the substrate 110 during manufacturing, and the IDT electrode layer 130 is formed on the first layer 120 in a fine pattern, by a method such as lift-off or dry etching. A portion of the first layer 120, other than a portion in which the pattern of the IDT electrode layer 130 is laminated, is exposed to the outside environment, and the exposed portion of the first layer 120 is oxidized when exposed to an oxide atmosphere, or when heat or electricity is applied, to form the metal oxide layer 124.

As a result, the first layer 120 includes the metal layer 122 and the metal oxide layer 124.

The first layer 120 is a diffusion preventing layer that prevents diffusion between the IDT electrode layer 130 and the substrate 110, and between the substrate 110 and the overlay layer 150. The first layer 120 also improves adhesion between the overlay layer 150, the IDT electrode layer 130 and the substrate 110.

Since resistance needs to be large so that minimal current flows between the IDT electrode layers 130, in an example, a thickness of the first layer 120 should not exceed 20 nm, so as to form an oxide film.

Further, if the first layer 120 is too thin, the diffusion preventing effect of the electrode layer 130 may be insignificant and the adhesion improving effect may not be provided. Therefore, in an example, the thickness of the first layer 120 should be 3 nm or more. Accordingly, the first layer 120 may have a thickness in a range of 3 nm to 20 nm.

The IDT electrode layer 130 is formed on the first layer 120. For example, the IDT electrode layer 130 is formed on the metal layer 122 of the first layer 120. Further, the IDT electrode layer 130 may be formed of a copper (Cu) material as a main component. The Cu material may have a low resistance and a high electric machine coupling factor with the substrate 110. The IDT electrode layer 130 may also be formed of a single material, but may also have a structure of a multilayered film including a plurality of materials.

For example, the IDT electrode layer 130 has a comb pattern and a plurality of rows and columns. The IDT electrode layer 130 may be formed by a patterning process of lift-off or dry etching.

The second layer 140 covers the IDT electrode layer 130 and the first layer 120. Further, the second layer 140 includes the metal oxide layer formed of any one or any combination of any two or more of titanium oxide ($TiO_x$), chromium oxide ($CrO_x$), and aluminum oxide ($Al_2O_x$). However, the second layer 140 may not be formed of only the metal oxide layer, and therefore may be formed of a non-metallic layer.

An oxide film formed of any one or any combination of any two or more of titanium oxide ($TiO_x$), chromium oxide ($CrO_x$), and aluminum oxide ($Al_2O_x$) may be directly coated on the IDT electrode layer 130 to cover the IDT electrode layer 130 and the first layer 120, such that the second layer 140 is formed. The second layer 140 may be formed by physical vapor deposition (PVD), such as sputtering.

Alternatively, a metal film formed of any one or any combination of any two or more of titanium (Ti), chromium (Cr), and aluminum (Al) may be coated on the IDT electrode layer 130 to completely cover the IDT electrode layer 130 and the first layer 120, and then formed into the oxide film by increasing temperature or by diffusing oxygen through contact with silicon oxide ($SiO_2$) in an oxygen atmosphere during a post-process, such that the second layer 140 is formed.

The second layer 140 completely covers the IDT electrode layer 130, and, as a result, a side surface of the IDT electrode layer 130 does not directly contact the overlay layer 150, thereby forming an interface having excellent adhesion, while preventing materials such as copper (Cu) from being diffused in the IDT electrode layer 130.

In addition, since the overlay layer 150 is formed on the second layer 140, it is possible to alleviate a deformation due to a difference in stresses and coefficients of thermal expansion of the substrate 110 and the overlay layer 150, while maintaining a high degree of adhesion of the overlay layer 150.

The second layer 140 needs to have a high resistance, so that minimal current flows between the adjacent IDT electrode layers 130 and does not cause a degradation in characteristics thereof. Accordingly, in an example, the thickness of the second layer 140 should not exceed 20 nm. However, if the second layer 140 is too thin, the side surface of the IDT electrode layer 130 may not be completely coated, and therefore the diffusion preventing effect may be insignificant and the adhesion improving effect may not be provided. To avoid this problem, in an example, the thickness of the second layer 140 should be 3 nm or more. Therefore, the second layer 140 may have a thickness in a range of 3 nm to 20 nm.

The overlay layer 150 covers the second layer 140 and is formed of silicon oxide ($SiO_2$), for example. The overlay layer 150 has a positive frequency characteristic in which a propagation speed of the surface acoustic wave (SAW) increases with an increase in temperature. As such, an absolute value of a frequency temperature coefficient of the surface acoustic wave filter device 100 is decreased by forming the overlay layer 150.

As described above, the second layer 140 covers the IDT electrode layer 130, and, as a result, the side surface of the IDT electrode layer 130 does not directly contact the overlay layer 150, thereby forming the interface having high adhesion while preventing metal from being diffused in the IDT electrode layer 130 and suppressing a formation of a void.

In addition, the overlay layer 150 is formed on the second layer 140, and, as a result, it is possible to alleviate a difference in coefficients of thermal expansion of the substrate 110 and the overlay layer 150, while maintaining high adhesion of the overlay layer 150.

Hereinafter, an example method of manufacturing the surface acoustic wave filter device 100 will be described, with reference to the accompanying drawings.

FIGS. 2 through 6 are process diagrams illustrating a method of manufacturing the surface acoustic wave filter device 100, according to an embodiment.

Figure 2:
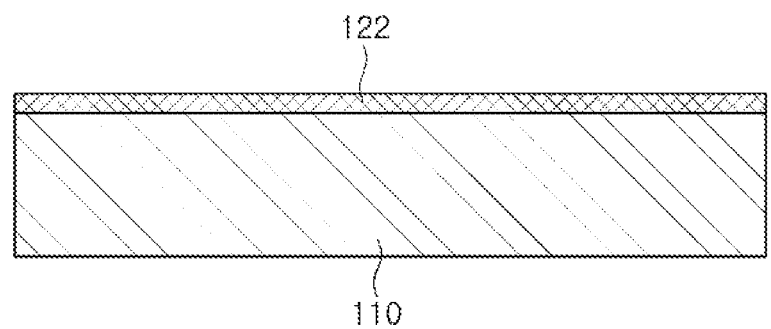
FIGS. 2 through 6 are process diagrams illustrating a method of manufacturing the surface acoustic wave filter device of FIG. 1, according to an embodiment.

First, referring to FIG. 2, the first layer 120 is formed on the substrate 110. The first layer 120 may be a metal layer, formed of any one or any combination of any two or more of titanium (Ti), chromium (Cr), and aluminum (Al). Alternatively, the first layer 120 may be formed of an alloy of any one or any combination of any two or more of titanium (Ti), chromium (Cr), and aluminum (Al).

Figure 3:
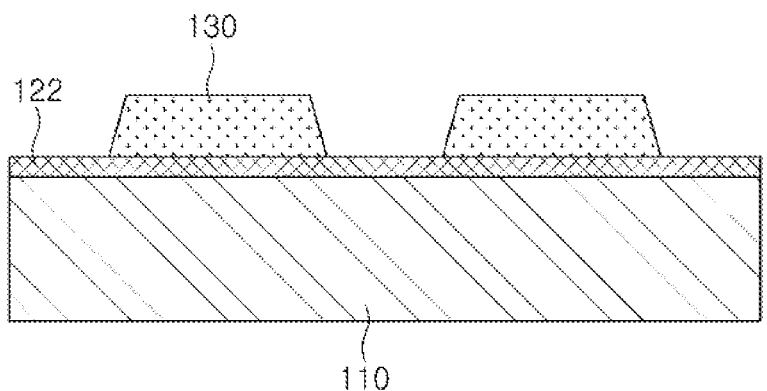

Next, as shown in FIG. 3, the IDT electrode layer 130 is formed on the first layer 120. The IDT electrode layer 130 may be formed of a copper (Cu) material as a main component. The Cu material may have a low resistance and a high electric machine coupling factor with the substrate 110. However, the material of the IDT electrode layer 130 is not be limited to Cu, and therefore the IDT electrode layer 130 may be formed of materials such as aluminum (Al), manganese (Mo), and platinum (Pt).

For example, the IDT electrode layer 130 is formed to have a comb pattern and to have a plurality of rows and columns. The IDT electrode layer 130 may be formed by a patterning process of lift-off or dry etching, according to a material that is used. The IDT electrode layer 130 may also be formed of a single material, or may have a structure of a multilayered film, using a plurality of materials.

Figure 4:
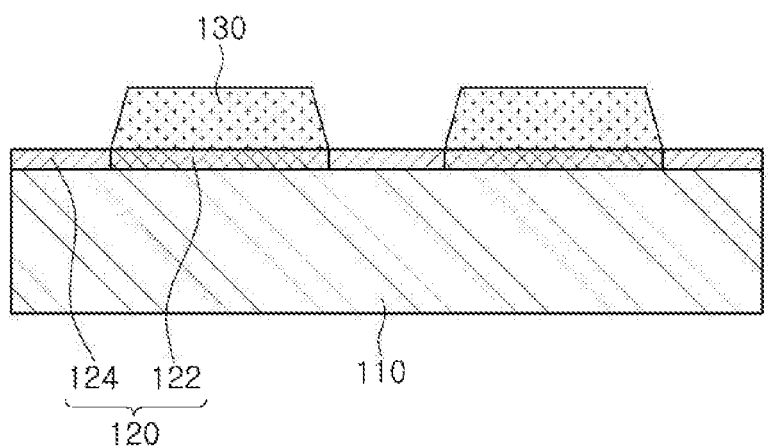

Next, as shown in FIG. 4, the first layer 120 is maintained as the metal layer 122 only in the region disposed under the IDT electrode layer 130, and areas of the first layer 120 other than the region disposed under the IDT electrode layer 130 include the metal oxide layer 124. The metal oxide layer 124 may be formed of any one or any combination of any two or more of titanium oxide ($TiO_x$), chromium oxide ($CrO_x$), and aluminum oxide ($Al_2O_x$), as a main component. The metal layer 122 is oxidized by increasing temperature or by applying an electric field in an oxygen atmosphere, to be formed into the metal oxide layer 124 in the areas other than the region disposed under the IDT electrode layer 130.

Figure 5:
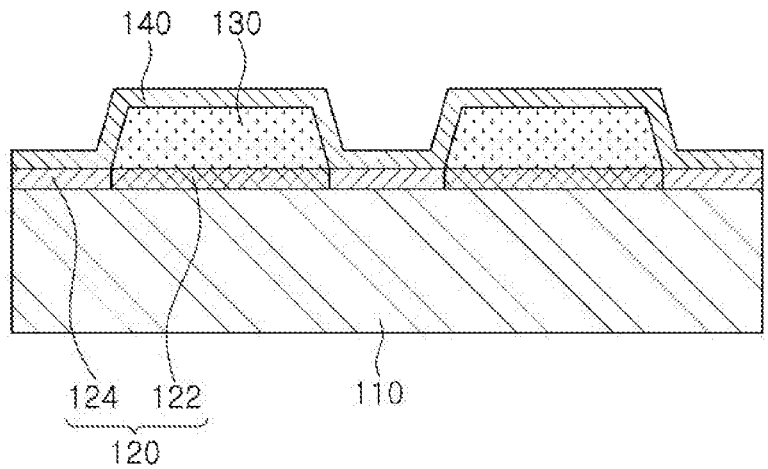

Next, as shown in FIG. 5, the second layer 140 is formed to completely cover the first layer 120 and the IDT electrode layer 130. For example, in the second layer 140, the oxide film formed of any one or any combination of any two or more of titanium oxide ($TiO_x$), chromium oxide ($CrO_x$), and aluminum oxide ($Al_2O_x$) is formed and the metal oxide layer 124 is formed by a method of directly coating oxide to cover the IDT electrode layer 130 and the first layer 120, or by a method of coating and oxidizing the corresponding metal film. The metal oxide layer 124 may also be formed by a method of coating and oxidizing the corresponding metal film, while the second layer 140 may be formed by sputtering.

As discussed above with respect to FIG. 1, the second layer 140 needs to have a high resistance, so that minimal current flows between the adjacent IDT electrode layers 130 and current flow does not cause a degradation in characteristics of the adjacent IDT electrode layers 130. Accordingly, the thickness of the second layer 140 should not exceed 20 nm, according to an example. However, as mentioned above, if the second layer 140 is too thin, the side surface of the IDT electrode layer 130 may not be completely coated, and therefore the diffusion preventing effect may be insignificant and the adhesion improving effect may not be provided. Thus, according to an example, the thickness of the second layer 140 should be 3 nm or more. Therefore, the thickness of the second layer 140 may be in a range of 3 nm to 20 nm.

Figure 6:
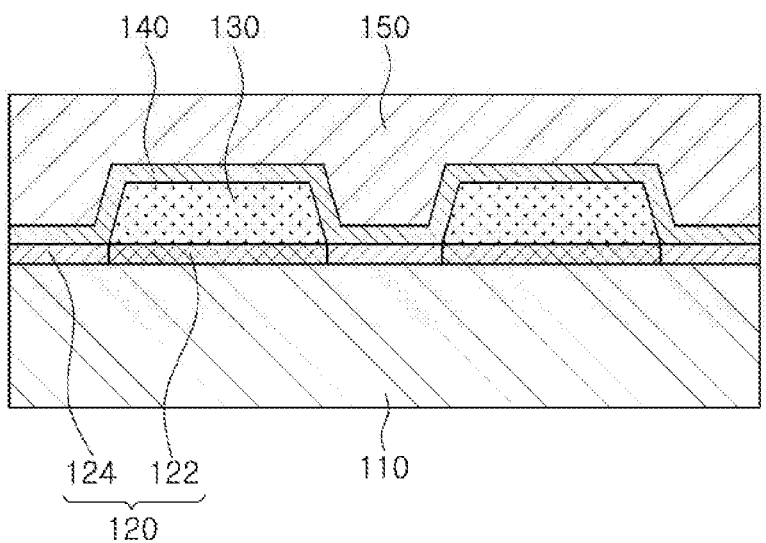

Next, as shown in FIG. 6, the overlay layer 150 is formed to be sufficiently thick to cover the second layer 140. The overlay layer 150 may be formed of the silicon oxide ($SiO_2$) material. The thickness of the overlay layer 150 may vary depending on desired frequency characteristics and temperature change characteristics of a product.

As described above, the second layer 140 is formed to cover the IDT electrode layer 130, and, as a result, the side surface of the IDT electrode layer 130 does not directly contact the overlay layer 150, thereby forming the interface having high adhesion while preventing diffusion of the IDT electrode layer 130 and suppressing a formation of a void.

In addition, the overlay layer 150 is formed on the second layer 140, and, as a result, it is possible to alleviate a difference in coefficients of thermal expansion of the substrate 110 and the overlay layer 150, while maintaining high adhesion of the overlay layer 150.

Hereinafter, a surface acoustic wave filter device 200 and a method of manufacturing the surface acoustic wave filter device 200, according to additional embodiments, will be described with reference to the accompanying drawings.

Figure 7:
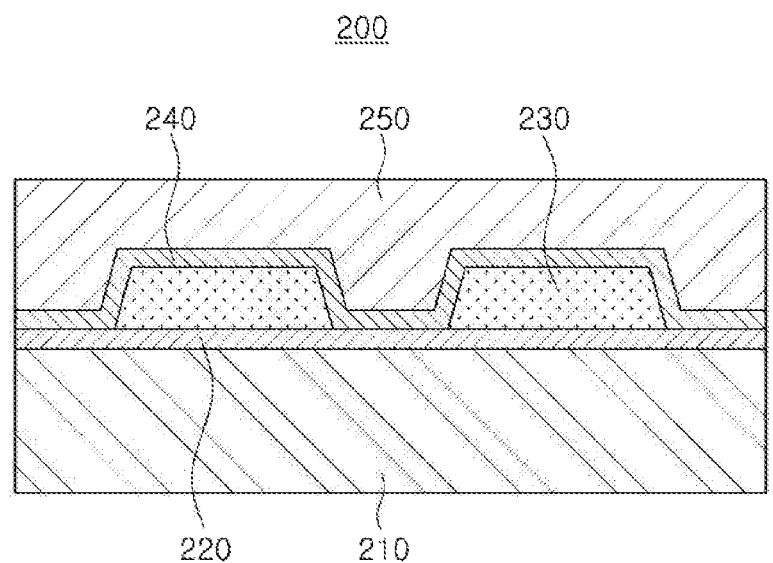
FIG. 7 is a schematic cross-sectional view showing a surface acoustic wave filter device, according to another embodiment.

FIG. 7 is a schematic cross-sectional view showing the surface acoustic wave filter device 200, according to an embodiment.

Referring to FIG. 7, the surface acoustic wave filter device 200 includes, for example, a substrate 210, a first layer 220, an IDT electrode layer 230, a second layer 240, and an overlay layer 250.

The substrate 210 is, for example, a $LiNbO_3$ substrate (LN wafer substrate). However, the substrate is not limited to such an example, and therefore the substrate 210 may be either a $LiNbO_3$ substrate or a $LiTaO_3$ substrate, used as a piezoelectric substrate.

The first layer 220 is formed on the substrate 210. For example, the first layer 220 includes a metal oxide layer or an oxide layer. For example, the first layer 220 is formed of any one or any combination of any two or more of titanium oxide ($TiO_x$), chromium oxide ($CrO_x$), and aluminum oxide ($Al_2O_x$), as a main component.

For example, an oxide film formed of any one or any combination of any two or more of titanium oxide ($TiO_x$), chromium oxide ($CrO_x$), and aluminum oxide ($Al_2O_x$) is directly coated to cover the substrate 210, such that the first layer 220 is formed. In this case, if the first layer 220 is formed by sputtering, the first layer 220 is manufactured to have a uniform thickness and composition at a low temperature.

Alternatively, a metal film formed of any one of titanium (Ti), chromium (Cr), and aluminum (Al), or an alloy film of any one or any combination of any two or more of Ti, Cr, and Al, may be coated to uniformly cover the substrate 210, and may then be formed into the oxide film, through oxygen diffusion, by increasing temperature or by applying an electric field in an oxygen atmosphere during a post-process, such that the first layer 220 is formed.

The first layer 220 may have a thickness in a range of 3 nm to 20 nm.

The IDT electrode layer 230 is formed on the first layer 220. For example, the IDT electrode layer 230 is formed of a copper (Cu) material, as a main component. The Cu material may have a low resistance and a high electric machine coupling factor with the substrate 210. The IDT electrode layer 230 may be formed of a single material, or may have a structure of a multilayered film using a plurality of materials.

For example, the IDT electrode layer 230 has a comb pattern and a plurality of rows and columns. The IDT electrode layer 230 may be formed by a patterning process of lift-off or dry etching.

The second layer 240 covers the IDT electrode layer 230 and the first layer 220. Further, the second layer 240 includes a metal oxide layer formed of any one or any combination of any two or more of titanium oxide ($TiO_x$), chromium oxide ($CrO_x$), and aluminum oxide ($Al_2O_x$).

For example, an oxide film formed of any one or any combination of any two or more of titanium oxide ($TiO_x$), chromium oxide ($CrO_x$), and aluminum oxide ($Al_2O_x$) may be directly coated, thinly and uniformly, so as to cover the IDT electrode layer 230 and the first layer 220, such that the second layer 240 is formed. In this case, the second layer 240 may be formed by sputtering.

Alternatively, a metal film formed of any one or any combination of any two or more of titanium (Ti), chromium (Cr), and aluminum (Al) may be coated to completely cover the IDT electrode layer 230 and the first layer 220 and then formed into the oxide film by increasing temperature or by applying an electric field in an oxygen atmosphere during a post-process, such that the second layer 240 is formed.

As described above, the second layer 240 is formed to cover the IDT electrode layer 230, and, as a result, the side surface of the IDT electrode layer 230 is not directly contact the overlay layer 250, thereby forming an interface having high adhesion while preventing metal from being diffused in the IDT electrode layer 230 and suppressing a void from being formed at the interface thereof.

In addition, since the overlay layer 250 is formed on the second layer 240, it is possible to alleviate deformation due to the difference in the stresses and the coefficients of thermal expansion of the substrate 210 and the overlay layer 250, while maintaining high adhesion of the overlay layer 250.

The second layer 240 needs to have a high resistance, so that minimal current flows between the adjacent IDT electrode layers 230 and current flow does not cause a degradation in characteristics of the adjacent IDT electrode layers 230. Accordingly, the thickness of the second layer 240 should not exceed 20 nm, according to an example. However, if the second layer 240 is too thin, the side surface of the IDT electrode layer 230 may not be completely coated, and therefore the diffusion preventing effect may be insignificant and the adhesion improving effect may not be provided. Thus, the thickness of the second layer 240 should be 3 nm or more, according to an example. Therefore, the thickness of the second layer 240 may be in a range of 3 nm to 20 nm.

The overlay layer 250 is sufficiently thick to cover the second layer 240 and is formed of silicon oxide ($SiO_2$), for example. The overlay layer 250 is coated at a proper thickness in consideration of the desired frequency characteristics and the temperature change characteristics of a product. The overlay layer 250 is formed of a material that has positive frequency temperature characteristics, in which the propagation speed of the surface acoustic wave (SAW) increases with an increase in temperature. As such, an absolute value of a frequency temperature coefficient of the SAW filter device 200 is decreased by forming the overlay layer 250.

As described above, the second layer 240 covers the IDT electrode layer 230, and, as a result, the side surface of the IDT electrode layer 230 does not directly contact the overlay layer 250, thereby forming an interface having high adhesion while preventing metal from being diffused in the IDT electrode layer 230 and suppressing the formation of the void.

In addition, the overlay layer 250 is formed on the second layer 240, and, as a result, it is possible to alleviate a difference in coefficients of thermal expansion of the substrate 210 and the overlay layer 250, while maintaining high adhesion of the overlay layer 250.

Hereinafter, an example method of manufacturing the surface acoustic wave filter device 200 will be described, with reference to the accompanying drawings.

FIGS. 8 through 11 are process diagrams illustrating a method of manufacturing the surface acoustic wave filter device 200, according to an embodiment.

Figure 8:
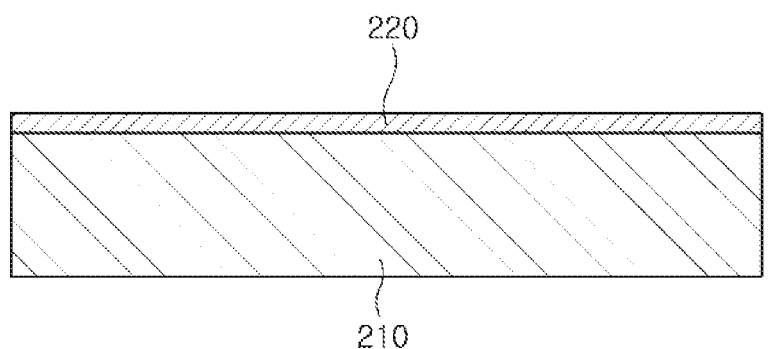
FIGS. 8 through 11 are process diagrams illustrating a method of manufacturing the surface acoustic wave filter device of FIG. 7, according to an embodiment.

First, as shown in FIG. 8, the first layer 220 is formed on the substrate 210. The first layer 220 includes a metal oxide layer. For example, the first layer 220 is formed of any one or any combination of any two or more of titanium oxide ($TiO_x$), chromium oxide ($CrO_x$), and aluminum oxide ($Al_2O_x$).

For example, an oxide film formed of any one or any combination of any two or more of titanium oxide ($TiO_x$), chromium oxide ($CrO_x$), and aluminum oxide ($Al_2O_x$) is directly coated to cover the substrate 210, such that the first layer 220 is formed. In this case, the first layer 220 may be formed by sputtering.

Alternatively, a metal film formed of any one of titanium (Ti), chromium (Cr), and aluminum (Al), or an alloy film of any one or any combination of any two or more of Ti, Cr, and Al is coated to cover the substrate 210, and then formed into the oxide film through oxygen diffusion into the corresponding metal by increasing temperature or by applying an electric field in an oxygen atmosphere during a post-process, such that the first layer 220 is formed.

Figure 9:
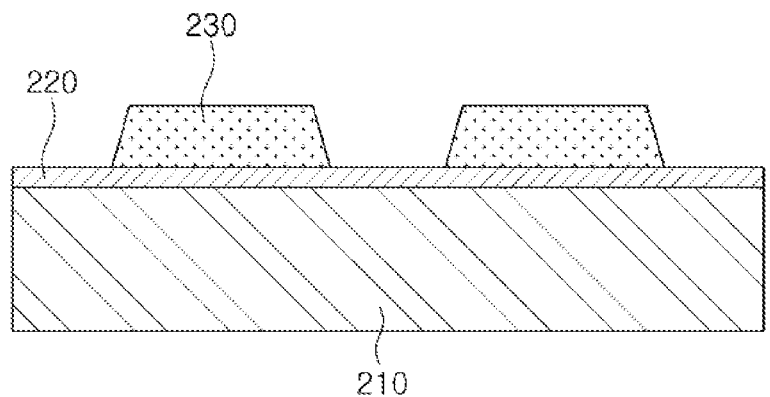

Next, as shown in FIG. 9, the IDT electrode layer 230 is formed on the first layer 220. The IDT electrode layer 230 may be formed of a copper (Cu) material as a main component. The Cu material may have a low resistance and a high electric machine coupling factor with the substrate 210. The IDT electrode layer 230 may be formed of a single material, but may also have a structure of a multilayered film using a plurality of materials.

For example, the IDT electrode layer 230 is formed to have a comb pattern and a plurality of rows and columns. The IDT electrode layer 230 may be formed by a patterning process of lift-off or dry etching.

Figure 10:
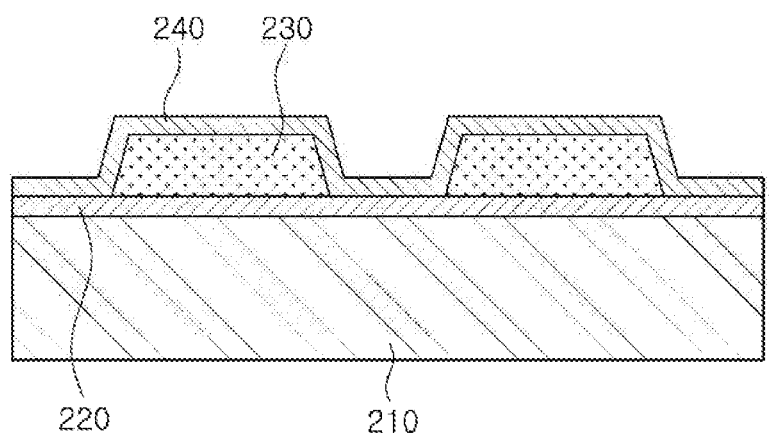

Next, as shown in FIG. 10, the second layer 240 is formed to completely cover the first layer 220 and the IDT electrode layer 230 uniformly and thinly. An oxide film formed of any one or any combination of any two or more of titanium oxide ($TiO_x$), chromium oxide ($CrO_x$), and aluminum oxide ($Al_2O_x$) is directly coated to cover the IDT electrode layer 230 and the first layer 220, such that the second layer 240 is formed. The second layer 240 may be formed to have a uniform composition and thickness at a low temperature by sputtering.

The second layer 240 needs to have a high resistance so that minimal current flows between the adjacent IDT electrode layers 230, and current flow does not cause a degradation in characteristics. Accordingly, the thickness of the second layer 240 should not exceed 20 nm, according to an example. However, if the second layer 240 is too thin, the side surface of the IDT electrode layer 230 may not be completely coated, and therefore the diffusion preventing effect may be insignificant and the adhesion improving effect may not be provided. Thus, according to an example, the thickness of the second layer 240 should be 3 nm or more. Therefore, the thickness of the second layer 240 may be in a range of 3 nm to 20 nm.

Figure 11:
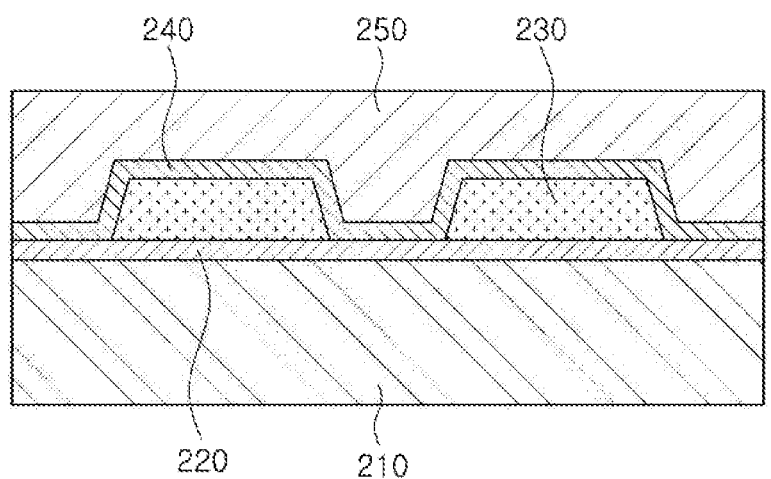

Next, as shown in FIG. 11, the overlay layer 250 is formed to sufficiently cover the second layer 240. The overlay layer 250 may be formed of a silicon oxide ($SiO_2$) material.

As described above, the second layer 240 is formed to cover the IDT electrode layer 230, and, as a result, the side surface of the IDT electrode layer 230 does not directly contact the overlay layer 250, thereby forming an interface having high adhesion while preventing metal from being diffused in the IDT electrode layer 230 and suppressing the void from being formed at the interface thereof.

In addition, since the overlay layer 250 is formed on the second layer 240, it is possible to alleviate deformation due to the difference in the stresses and the coefficients of thermal expansion of the substrate 210 and the overlay layer 250, while maintaining high adhesion of the overlay layer 250.

As set forth above, according to the embodiments disclosed herein, it is possible to prevent a copper (Cu) metal of an IDT electrode layer from being oxidized and migrated, in order to smooth transmission of a surface acoustic wave and improve adhesion between the overlay layer, the IDT electrode layer and the substrate.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A surface acoustic wave (SAW) filter device, comprising:
a first layer comprising a first set of materials disposed on a substrate;
an inter-digital transducer (IDT) electrode layer disposed on the first layer;
a second layer in direct contact with the IDT electrode layer, covering the IDT electrode layer and the first layer, and comprising a second set of materials different from the first set of materials; and
an overlay layer covering the second layer and comprising an overlay material,
wherein the first set of materials comprises a first metal material, and any one or any combination of a first metal oxide material and a first oxide material,
wherein the first metal material is in direct contact with the substrate,
wherein at least a portion of the IDT electrode layer is disposed in contact with the first metal material, and a portion of the second set of materials is disposed in contact with the any one or any combination of the first metal oxide material and the first oxide material, and
wherein any one or any combination of the first set of materials and the second set of materials block the overlay material from contacting the substrate at least between digits of the IDT.

2. The SAW filter device of claim 1, wherein the first metal material comprises
any one or any combination of any two or more of titanium (Ti), chromium (Cr), and aluminum (Al), or
an alloy comprising any one or any combination of any two or more of titanium (Ti), chromium (Cr), and aluminum (Al), as a main component.

3. The SAW filter device of claim 2, wherein the first metal oxide material comprises any one or any combination of any two or more of titanium oxide ($TiO_x$), chromium oxide ($CrO_x$), and aluminum oxide ($Al_2O_x$).

4. The SAW filter device of claim 3, wherein the first metal material is disposed under the IDT electrode layer.

5. The SAW filter device of claim 1, wherein the second set of materials comprises a second metal oxide material comprising any one or any combination of any two or more of titanium oxide ($TiO_x$), chromium oxide ($CrO_x$), and aluminum oxide ($Al_2O_x$).

6. The SAW filter device of claim 5, wherein a material of the first set of materials is the same as a material of the second set of materials.

7. The SAW filter device of claim 5, wherein the second layer comprises a thickness in a range of 3 nm to 20 nm.

8. The SAW filter device of claim 1, wherein the overlay layer comprises silicon oxide ($SiO_2$).

9. The SAW filter device of claim 1, wherein the first layer comprises a thickness in a range of 3 nm to 20 nm.

10. The SAW filter device of claim 1, wherein the first layer has a single thickness.

11. A method to manufacture a surface acoustic wave (SAW) filter, comprising:
forming a first layer comprising a first set of materials on a substrate;
forming inter-digital transducer (IDT) electrode layers on the first layer;
forming a second layer in direct contact with the IDT electrode layer to cover the first layer and the IDT electrode layers, wherein the second layer comprises a second set of materials different from the first set of materials; and
forming an overlay layer to cover the second layer and comprising an overlay material,
wherein the first set of materials comprises a first metal material, and any one or any combination of a first metal oxide material and a first oxide material,
wherein the first metal material is in direct contact with the substrate,
wherein at least a portion of the IDT electrode layer is disposed in contact with the first metal material, and a portion of the second set of materials is disposed in contact with the any one or any combination of the first metal oxide material and the first oxide material, and
wherein any one or any combination of the first set of materials and the second set of materials block the overlay material from contacting the substrate at least between digits of the IDT.

12. The method of claim 11, wherein the forming of the IDT electrode layers comprises oxidizing a portion of the first layer other than a portion of the first layer disposed under the IDT electrode layers to form the first metal oxide material.

13. The method of claim 12, wherein the first metal material comprises any one or any combination of any two or more of titanium (Ti), chromium (Cr), and aluminum (Al), as a main component, or an alloy comprising titanium (Ti), chromium (Cr), and aluminum (Al), as a main component.

14. The method of claim 12, wherein the first metal oxide layer comprises any one or any combination of any two or more of titanium oxide ($TiO_x$), chromium oxide ($CrO_x$), and aluminum oxide ($Al_2O_x$).

15. The method of claim 12, wherein the second set of materials comprises a second metal oxide layer comprising any one or any combination of any two or more of titanium oxide ($TiO_x$), chromium oxide ($CrO_x$), and aluminum oxide ($Al_2O_x$).

16. The method of claim 11, wherein the first metal oxide material comprises any one or any combination of any two or more of titanium oxide ($TiO_x$), chromium oxide ($CrO_x$), and aluminum oxide ($Al_2O_x$).

17. The method of claim 16, wherein the second set of materials comprises a second metal oxide material comprising any one or any combination of any two or more of titanium oxide ($TiO_x$), chromium oxide ($CrO_x$), and aluminum oxide ($Al_2O_x$).

18. The method of claim 11, wherein the overlay layer comprises silicon oxide ($SiO_2$).

19. The method of claim 11, wherein the substrate comprises either one of $LiNbNO_3$ and $LiTaO_3$.

20. A surface acoustic wave (SAW) filter device, comprising:
a first layer disposed on a substrate;
an inter-digital transducer (IDT) electrode layer disposed on the first layer;
a second layer in direct contact with the IDT electrode layer, covering the IDT electrode layer and the first layer, and comprising a second layer material; and
an overlay layer covering the second layer and comprising an overlay material,
wherein the first layer comprises a first metal material, and any one or any combination of a first metal oxide material and a first oxide material,
wherein the first layer has a single thickness
wherein at least a portion of the IDT electrode layer is disposed in contact with the first metal material, and a portion of the second layer material is disposed in contact with the any one or any combination of the first metal oxide material and the first oxide material, and
wherein the second layer material blocks the overlay material from contacting the first layer materials at least between digits of the IDT.

* * * * *